(12) United States Patent
Stecher et al.

(10) Patent No.: US 6,873,012 B2
(45) Date of Patent: Mar. 29, 2005

(54) SOI COMPONENT

(75) Inventors: Matthias Stecher, München (DE); Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/073,847

(22) Filed: Feb. 11, 2002

(65) Prior Publication Data

US 2002/0113275 A1 Aug. 22, 2002

(30) Foreign Application Priority Data

Feb. 9, 2001 (DE) .......................................... 101 06 073

(51) Int. Cl.⁷ .............................................. H01L 27/01
(52) U.S. Cl. ........................ 257/347; 257/487; 257/343
(58) Field of Search ................................ 257/347, 487, 257/343

(56) References Cited

U.S. PATENT DOCUMENTS 5,648,671 A * 7/1997 Merchant .................... 257/347
6,097,063 A * 8/2000 Fujihira ...................... 257/339
6,121,661 A * 9/2000 Assaderaghi et al. ........ 257/355
6,153,912 A 11/2000 Holst
6,221,737 B1 * 4/2001 Letavic et al. .............. 438/439

FOREIGN PATENT DOCUMENTS

| DE | 197 02 102 A1 | 7/1997 |
| EP | 0 497 427 A2 | 8/1992 |

* cited by examiner

Primary Examiner—Mark V. Prenty
(74) Attorney, Agent, or Firm—Laurence A. Greenberg; Werner H. Stemer; Ralph E. Locher

(57) ABSTRACT

A semiconductor component has a semiconductor substrate, an insulation layer located on the semiconductor substrate, and a semiconductor layer that is arranged on the insulation layer. A first doped terminal zone, a second doped terminal zone, and a drift zone are formed in the semiconductor layer between the first and second terminal zones. At least one of the first and second terminal zones directly adjoins the semiconductor substrate.

13 Claims, 3 Drawing Sheets

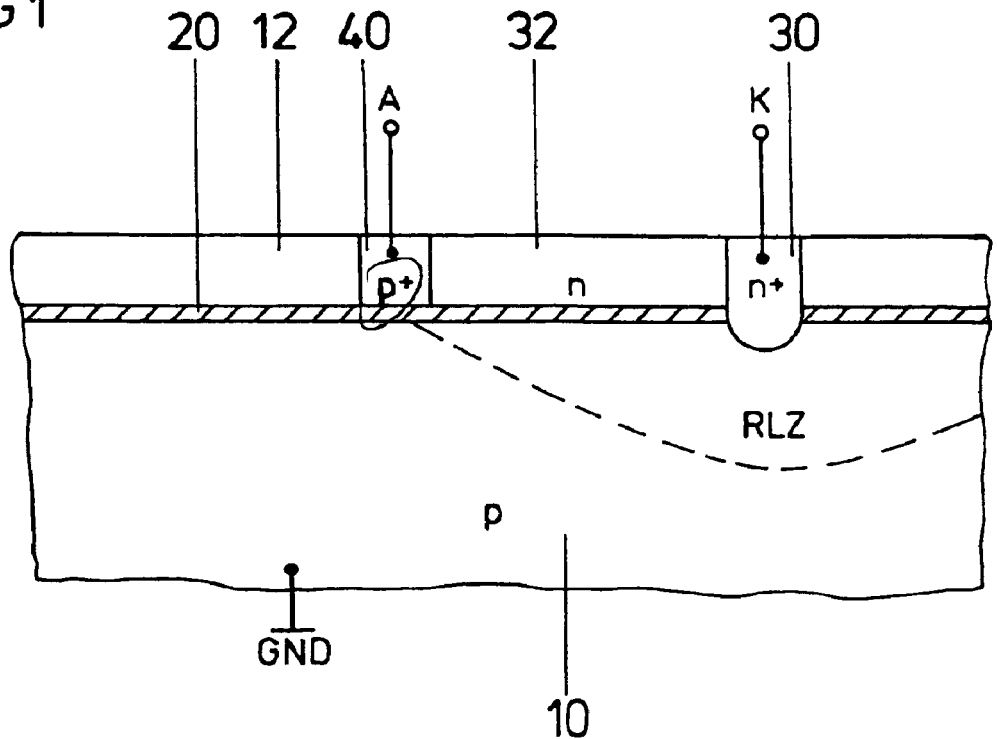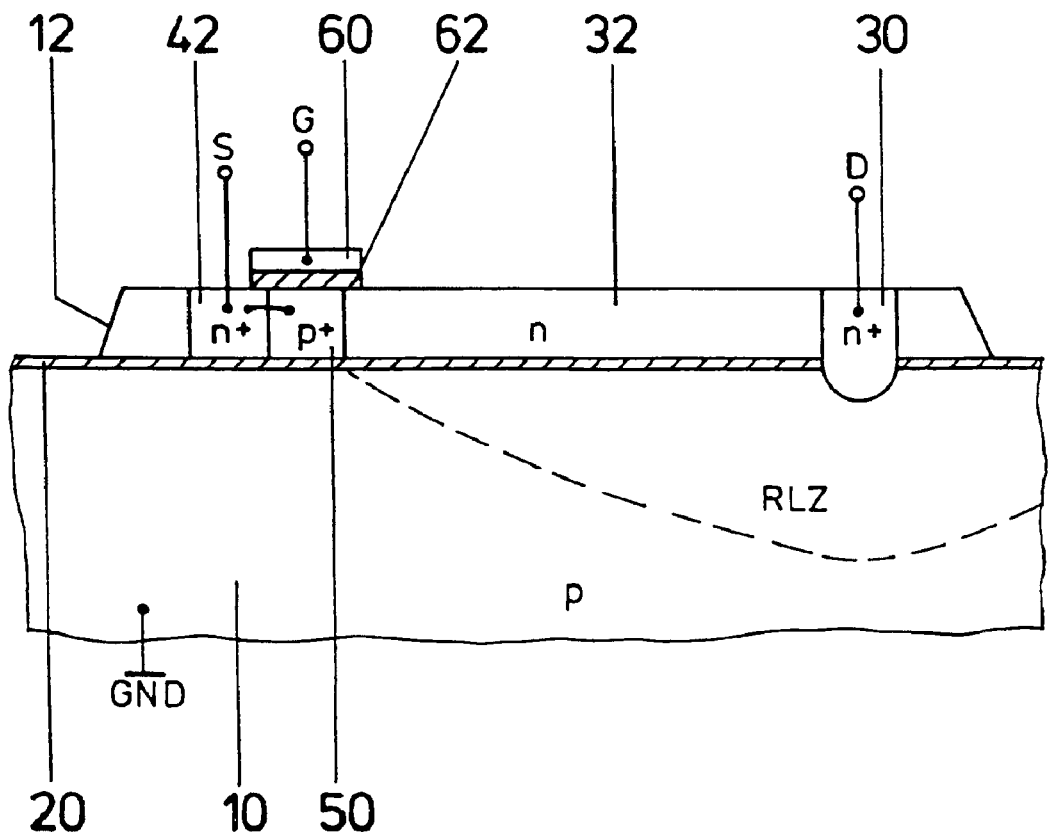

SOI COMPONENT

BACKGROUND OF THE INVENTION

Field of the Invention

The present invention relates to a semiconductor component that includes a semiconductor substrate, an insulation layer located on the semiconductor substrate, a semiconductor layer configured on the insulation layer, a first doped terminal zone and a second doped terminal zone that are formed in the insulation layer, and a drift zone that is formed in the insulation layer and between the first doped terminal zone and the second doped terminal zone.

Components of this type, in which the active regions of the component are formed on an insulation layer on a semiconductor substrate, are referred to as an SOI (Silicon On Insulator) component if the semiconductor material used is silicon.

SOI technology has advantages particularly when a logic circuit with a multiplicity of complementary metal oxide semiconductor transistors (CMOS transistors) will be realized. In conventional technologies, the CMOS transistors or the semiconductor regions in which they are realized are insulated from one another by doped zones made of semiconductor material. The sequence of differently doped semiconductor regions between the individual components gives rise to parasitic components that adversely affect the mode of operation of the entire circuit. Moreover, under certain circumstances, large parasitic capacitances are present, which adversely influence the switching speed of such a circuit.

In SOI technology, CMOS transistors and other semiconductor components can be realized beside one another in a semiconductor layer on the insulation layer. The semiconductor layer between the individual components is then simply removed down to the insulation layer in order to insulate the components from one another. In this case, electrical connections between the components are realized in a separate wiring plane above the semiconductor layer.

In addition to drive logic, it is also desirable to use CMOS technology to realize power components in the semiconductor layer on the insulation layer, for example, power MOSFETs or bipolar transistors that have a considerably higher dielectric strength than the logic transistors. Customary supply voltages for logic transistors lie between 1.5 V and 5 V, while the voltages that occur in power components are usually between 10 V and 100 V or more.

The dielectric strength of a transistor formed on an insulation layer on a substrate is determined by the thickness of the insulation layer. The substrate below the insulation layer is normally at the lowest potential present in a circuit, usually ground, so that the insulation layer has to take up the voltage difference between the largest potential in the circuit arrangement above the insulation layer and the lowest potential.

In order to realize power components on an insulation layer on a substrate, it is known to use an insulation layer having a thickness of up to 1 $\mu$m, in order to increase the dielectric strength, while the thickness of the insulation layer is usually between 50 nm and 200 nm in the case of SOI circuits for drive logic.

This entails a number of disadvantages: the thickness of the insulation layer influences the properties of the components that are realized. In order to obtain components having the same properties, it is necessary to determine dedicated design parameters for each insulation layer having a different thickness. These parameters are required when fabricating components. Moreover, the mechanical stress in the structure including the semiconductor substrate, the insulation layer, and the overlying semiconductor layer increases as the thickness of the insulation layer increases. Finally, the thermal resistance increases between the semiconductor layer, in which the components are realized, and the semiconductor substrate. As a result, the heat produced in the components is dissipated to a lesser extent via the substrate, which can be applied to a heat sink, as the thickness of the insulation layer increases. However, the ability to take up power loss and emit it to the surroundings in the form of a heat plays an important part in power components. Thus, for example, in driving motor bridges using power transistors, the power transistors must be designed to take up the power loss and dissipate it as heat.

SUMMARY OF THE INVENTION

It is accordingly an object of the invention to provide an SOI semiconductor component which overcomes the above-mentioned disadvantages of the prior art apparatus and methods of this general type.

In particular, it is an object of the invention to provide a semiconductor component having a semiconductor substrate, an insulation layer on the semiconductor substrate, and a semiconductor layer on the insulation layer, which has a high dielectric strength and a low thermal resistance between the substrate and the semiconductor layer.

With the foregoing and other objects in view there is provided, in accordance with the invention, a semiconductor component that includes: a semiconductor substrate; an insulation layer located on the semiconductor substrate; a semiconductor layer configured on the insulation layer; a first doped terminal zone and a second doped terminal zone formed in the insulation layer; and a drift zone formed in the insulation layer. The drift zone is formed between the first doped terminal zone and the second doped terminal zone. At least one of the first doped terminal zone and the second doped terminal zone directly adjoins the semiconductor substrate.

In accordance with an added feature of the invention, the first terminal zone and the second terminal zone reach through the insulation layer into the substrate.

In accordance with an additional feature of the invention, the first terminal zone and the second terminal zone are doped complementary with respect to the semiconductor substrate.

In accordance with another feature of the invention, the second terminal zone is of a complementary conduction type with respect to the first terminal zone.

In accordance with a further feature of the invention, a depletion zone is configured between the second terminal zone and the drift zone; the depletion zone has a conduction type; and the first terminal zone and the second terminal zone having a conduction type that is complementary to the conduction type of the depletion zone.

In accordance with a further added feature of the invention, the first terminal zone has a conduction type; and the drift zone has a conduction type that is equivalent to the conduction type of the first terminal zone.

In accordance with a further additional feature of the invention, the drift zone includes a plurality of complementary doped adjacent sections.

In accordance with yet an added feature of the invention, the plurality of the complementary doped adjacent sections includes first sections and second sections; the first sections and the first terminal zone are of a first conduction type; the first sections are connected to the first terminal zone; the second sections and the depletion zone are of a second conduction type complementary to the first conduction type; and the second sections are connected to the depletion zone.

In accordance with yet an additional feature of the invention, the plurality of the complementary doped adjacent sections includes first sections and second sections; the first sections and the first terminal zone are of a first conduction type; the first sections are connected to the first terminal zone; the second sections and the second terminal zone are of a second conduction type complementary to the first conduction type; and the second sections are connected to the second terminal zone.

In accordance with an added feature of the invention, the plurality of the complementary doped adjacent sections run in a longitudinal direction between the first terminal zone and the second terminal zone.

In accordance with an additional feature of the invention, a depletion zone is configured between the second terminal zone and the drift zone; and the plurality of the complementary doped adjacent sections run between the first terminal zone and the depletion zone.

In accordance with another feature of the invention, the semiconductor substrate is p-doped, and either the first doped terminal zone or the second doped terminal zone directly adjoins the semiconductor substrate and is n-doped. Additionally, however, both the first doped terminal zone and the second doped terminal zone can directly adjoin the semiconductor substrate and can be n-doped.

The semiconductor component is a diode if the first and second terminal zones are doped complementary with respect to one another. One of the terminal zones forms the anode and the other of the terminal zones forms the cathode. The semiconductor component is a transistor if the terminal zones are of the same conduction type, in which case, in accordance with one embodiment of the invention, a depletion zone which is doped complementary with respect to the terminal zones is then arranged between the second terminal zone and the drift zone.

When a voltage is applied between the first and the second terminal zones, this voltage is taken up in the semiconductor layer essentially by the drift zone, which is usually doped more weakly than the first and second terminal zones, or the voltage is taken up in the depletion zone. The semiconductor substrate is usually at the lowest potential in the circuit and the conduction types of the terminal zone, directly adjoining the semiconductor substrate, and of the semiconductor substrate are chosen such that the semiconductor junction between the terminal zone and the semiconductor substrate is always reverse-biased. Proceeding from the terminal zone, directly adjoining the semiconductor substrate, a space charge zone forms in the semiconductor substrate when a voltage is applied between the first and second terminal zones, or when a positive potential is applied to the first terminal zone. The space charge zone also runs below the drift zone. Through the space charge zone, the potential in the semiconductor substrate below the drift zone and the insulation layer is higher than the lowest potential of the circuit, to which the semiconductor substrate is connected.

In the semiconductor component, by virtue of the space charge zone, the voltage present at the insulation zone between the drift zone and the semiconductor substrate is lower than the voltage difference between the potential at the first terminal zone and the lowest potential of the substrate.

Thus, in the semiconductor component, the thickness of the insulation zone does not have to be designed for the maximum voltage that occurs, but rather can be dimensioned to be thinner in accordance with the smaller potential difference between the drift zone and the space charge zone in the semiconductor substrate. As a result, a lower thermal resistance is achieved in the case of the customary electrical insulation layers, such as silicon nitride or silicon oxide, which have poor heat conducting properties.

The drift zone advantageously has, in the manner of a compensation component, adjacent respectively complementary doped sections that preferably each extend in the longitudinal direction between the first terminal zone and the depletion zone in the case of a transistor or between the first terminal zone and the second terminal zone in the case of a diode. The individual complementary doped sections are coordinated with one another such that the number of p-type charge carriers corresponds to the number of n-type charge carriers in the drift zone. When a reverse voltage is applied, the complementary doped sections are mutually depleted, resulting in a high breakdown voltage. The mutually depleting sections may be comparatively highly doped, and thus contribute to a low resistance when a forward voltage is applied.

Other features which are considered as characteristic for the invention are set forth in the appended claims.

Although the invention is illustrated and described herein as embodied in a soi component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross sectional view of a first exemplary embodiment of a semiconductor component that is designed as a diode;

FIG. 2 is a cross sectional view of a second exemplary embodiment of a semiconductor component that is designed as an MOS transistor;

DESCRIPTION OF THE PREFERRED EMBODIMENTS

Figure 3:
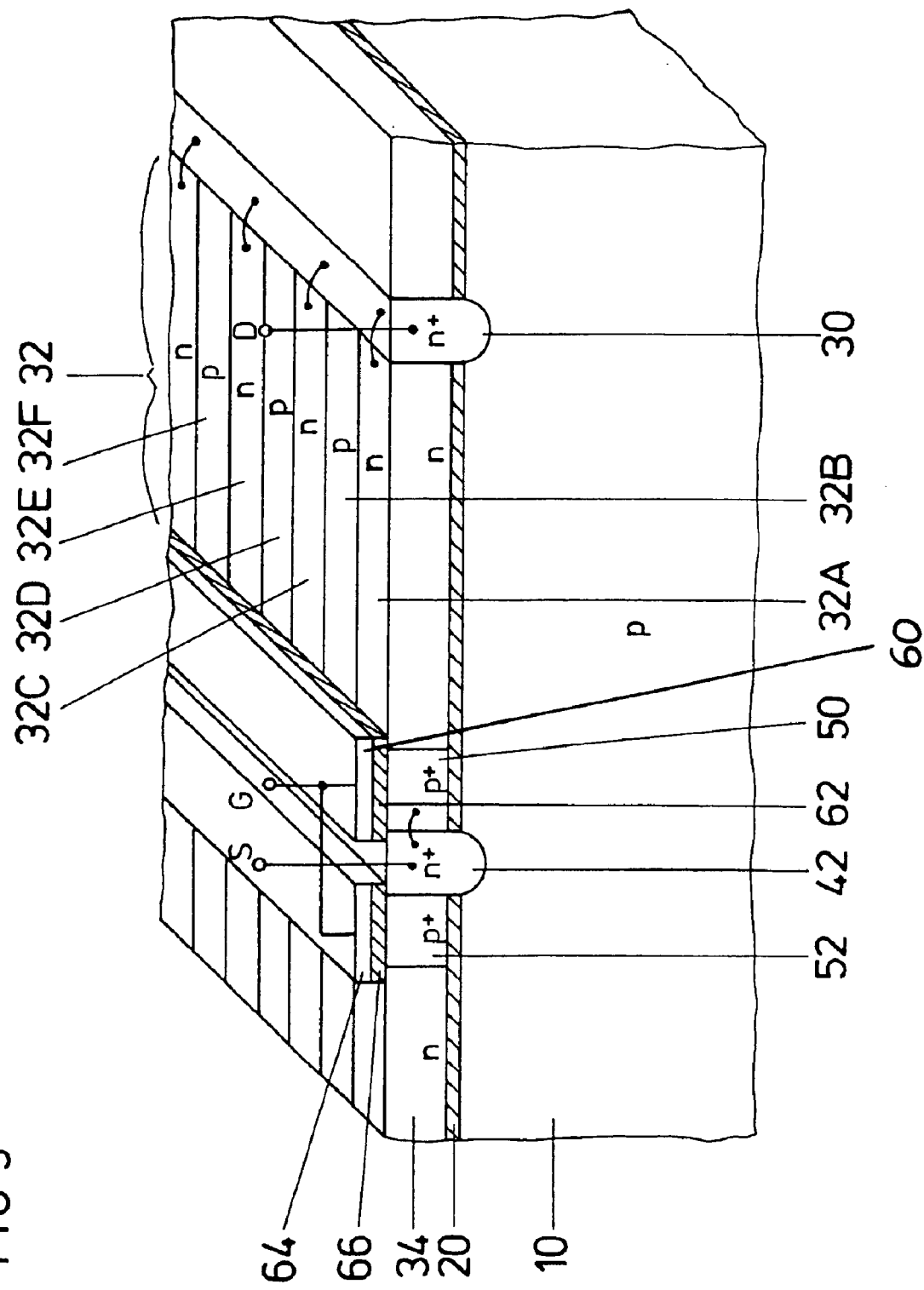
FIG. 3 shows an exemplary embodiment of a semiconductor component that is designed as a MOS transistor having complementary doped sections in the drift zone.

In all of the figures, unless otherwise specified, identical reference symbols designate identical parts and sections with the same meaning.

Referring now to the figures of the drawing in detail and first, particularly, to FIG. 1 thereof, there is shown a cross sectional view of a semiconductor component that is designed as a diode. The component has a semiconductor substrate 10 with an insulation layer 20 formed on the semiconductor substrate 10. The semiconductor substrate 10 is preferably composed of silicon, and the insulation layer 20 of silicon oxide or silicon nitride. A semiconductor layer 12 is arranged on the insulation layer 20. A first terminal zone 30 and a second terminal zone 40 are formed in the semiconductor layer 12. A drift zone 32 is formed in the semiconductor layer 12 and between the first and second terminal zones 30, 40. The first terminal zone 30 directly adjoins the semiconductor substrate 10, and in the exemplary embodiment, extends through the insulation layer 20 right into the semiconductor substrate 10.

The semiconductor substrate 10 and the first terminal zone 30, which directly adjoins the semiconductor substrate 10, are doped complementary. In the exemplary embodiment, the substrate 10 is p-doped and the first terminal zone 30 is n-doped. The doping type of the semiconductor substrate 10 and the doping type of the adjoining first terminal zone 30 are chosen, taking account of the potentials that are expected at the substrate 10 and the first terminal zone 30, such that the semiconductor junction between the first terminal zone 30 and the substrate 10 is always reverse-biased or free of voltage. If the substrate 10 is, as usual, at the lowest potential occurring in the circuit, for example ground GND, then the potential at the first terminal zone 30 can correspond to that of the substrate 10 and the semiconductor junction is then free of voltage, or the potential at the first terminal zone 30 can be greater than the potential of the substrate 10 and the semiconductor junction is then reverse-biased.

If the substrate 10 is always at the highest potential in the circuit, then, in contrast to the illustration in the exemplary embodiment, the first terminal zone 30 is p-doped and the substrate 10 is n-doped.

The first n-doped terminal zone 30 forms the cathode K of the component which is designed as a diode and illustrated in FIG. 1, and the p-doped second terminal zone 40 forms the anode.

When a reverse voltage is applied between the first terminal zone 30 and the second terminal zone 40, for which purpose the second terminal zone 40 is put at the potential of the substrate 10, for example, and the first terminal zone 30 is put at a positive potential, approximately the entire voltage is dropped across the drift zone 32, which is doped more lightly than the first and second terminal zones 30, 40.

In the semiconductor substrate 10, a space charge zone RLZ is formed proceeding from the first terminal zone 30. The boundary of the space charge zone is shown using a dashed line in FIG. 1. The potential in the space charge zone RLZ continuously decreases proceeding from the first terminal zone 30 toward the boundaries of the space charge zone RLZ. In this case, the space charge zone RLZ extends over the length of the drift zone 32 below the insulation layer 20. In a similar way in which the potential in the drift zone 32 decreases proceeding from the first terminal zone 30 up to the second terminal zone 40 and reaches a minimum value there, the potential of the space charge zone RLZ in the substrate 10 below the insulation layer 20 also decreases proceeding from the first terminal zone 30. Because of the space charge zone RLZ that forms below the drift zone 32 in the substrate 10, the maximum voltage present at the insulation layer 20 between the drift zone 32 and the substrate 10 is lower than the maximum voltage that occurs. The maximum voltage that occurs corresponds to the difference between the potential at the first terminal zone 30 and the lowest potential GND to which the substrate 10 is connected.

The voltage present at the insulation layer 20 is zero if the potential profile in the drift zone 32 corresponds to the potential profile in the space charge zone RLZ below the insulation layer 20. In the semiconductor component, by virtue of the space charge zone RLZ which can form through the first terminal zone 30 bearing directly on the substrate 10, the insulation layer 20 is thus exposed to a lower voltage loading than would be the case in comparable components in which the first terminal zone does not adjoin the substrate. As a result, in the case of the inventive component, it is possible to use a thinner insulation layer 20 than in comparable components with the same dielectric strength, which in turn leads to a lower thermal resistance between the semiconductor layer 12 above the insulation layer 20 and the substrate 10. This results in better heat dissipation from the semiconductor layer 12 into the substrate 10 and to a heat sink connected, if appropriate, to the substrate 10.

FIG. 2 shows an exemplary embodiment of an inventive semiconductor component that is designed as an n-channel MOS transistor. The component has a semiconductor substrate 10 with an insulation layer 20 that is applied on the substrate 10, and a semiconductor layer 12 that is applied on the insulation layer. An n-doped first terminal zone 30, an n-doped second terminal zone 42, and a drift zone 32 located between the first and second terminal zones 30, 42 are formed in the semiconductor layer 12. The first terminal zone 30 is doped complementary with respect to the substrate 10 and reaches through the insulation layer 20 right into the semiconductor substrate 10.

The drift zone 32 directly adjoins the first terminal zone 30. A p-doped depletion zone 50 is formed between the second terminal zone 42 and the drift zone 32. In the exemplary embodiment shown in FIG. 2, the first terminal zone 30 forms the drain zone, the second terminal zone 42 forms the source zone, and the depletion zone 50 forms the body zone (the body region) of the MOS transistor. A gate electrode 60 is applied above the depletion zone 50 and is insulated from the semiconductor layer 12 by an insulation layer 62.

When a potential that is positive relative to the reference-ground potential GND of the substrate 10 is applied to the drain zone 30 and when a lower potential, preferably the reference-ground potential GND, is applied to the source zone 42, a voltage drop occurs in the drift zone 32 between the drain zone 30 and the depletion zone 50 and a space charge zone RLZ is formed in the semiconductor substrate 10 proceeding from the drain zone 30, in which case the space charge zone RLZ can extend in the substrate 10 as far as below the depletion zone 50. The maximum voltage drop between the drain zone 30 and the source zone 42 is achieved when the transistor is in the off state, that is to say when there is no suitable drive voltage present between the gate 60 and the source 42. The insulation layer 20 must be dimensioned for this case.

By virtue of the formation of the space charge zone RLZ, the maximum voltage present at the insulation layer 20 is smaller than the difference between the potential at the drain zone 30 and the reference-ground potential GND. The MOS transistor according to the invention can thus be operated with voltages which are higher than those for which the insulation layer 20 is designed. The MOS transistor according to the invention can therefore be realized together with MOS transistors for drive logic circuitry on the same insulation layer, in which case the insulation layer need only be designed for the lower voltages occurring in the drive logic circuitry.

The MOS transistor can be realized, for example, with a dielectric strength of up to 40 V on an insulation layer that has a thickness—designed for realizing drive logic circuitry—of between 50 nm and 200 nm and is thus considerably thinner than the insulation layer normally designed for a dielectric strength of 40 V.

As shown in FIG. 2, the semiconductor layer 12 beside the transistor is preferably removed down to the insulation layer to insulate the transistor from other components (not illustrated) that are on the insulation layer 20. The connection between the transistor and the other components is effected in a wiring plane (not specifically illustrated) above the semiconductor layer 12.

FIG. 3 shows an exemplary embodiment of a semiconductor component that is designed as a MOS transistor and that differs from that illustrated in FIG. 2 by virtue of the fact that the n-doped source zone 42 also extends through the insulation layer 20 right into the p-doped semiconductor substrate 10. This MOS transistor is suitable, in particular, as a so-called high-side switch, in which both the source terminal and the drain terminal can be at a high potential. If a potential which is positive relative to the reference-ground potential GND is present at the source zone 42, and if the drain zone 30 is at reference-ground potential, then the space charge zone propagates in the semiconductor substrate 10 proceeding from the source zone 42.

In the case where a potential that is positive relative to the reference-ground potential GND is present both at the drain zone 30 and at the source zone 42, a space charge zone propagates proceeding from the drain zone 30 and the source zone 42.

The transistor according to FIG. 3 furthermore differs from that illustrated in FIG. 2 by virtue of the fact that the transistor is formed symmetrically with regard to the source zone 42. Thus, in the example, the source zone 42 is adjoined on the left by a further depletion zone 52 with an overlying gate electrode 64, a drift zone 34 and a further drain zone (not illustrated). The two gate electrodes 60, 64 are connected to one another, and the two drain zones are connected to one another.

The drift zone 32 may be of the same conduction type as the first terminal zone 30, i.e. the cathode in FIG. 1 and the drain zone D in FIG. 2, although the drift zone is doped more weakly than the first terminal zone 30. One embodiment of the invention provides for the drift zone to have respectively complementary doped sections 32A–32F, as is illustrated in the case of the perspectively illustrated MOS transistor in FIG. 3. In the exemplary embodiment shown in FIG. 3, n-doped sections 32A, 32C, 32E and p-doped sections 32B, 32D, 32F alternate. The sections 32A–32F extend in the longitudinal direction between the depletion zone 50 and the drain zone 30. The n-doped sections 32A, 32C, 32E are connected to the n-doped drain zone 30 and the p-doped sections are connected to the p-doped depletion zone 50.

The arrangement of complementary doped sections in the drift zone 32 is known from so-called compensation components. In this case, the n-doped sections 32A, 32C, 32E can be doped more highly than in the case of conventional components in which no complementary (p-doped) sections are present. The higher doping of the n-type sections 32A, 32C, 32E leads to a drift zone with a lower resistance when the component is in the on state, i.e. when a forward voltage is applied. When a reverse voltage is applied, the n-doped sections 32A, 32C, 32E and the p-doped sections 32B, 32D, 32F are mutually depleted, resulting in a high breakdown voltage.

Figure 4:
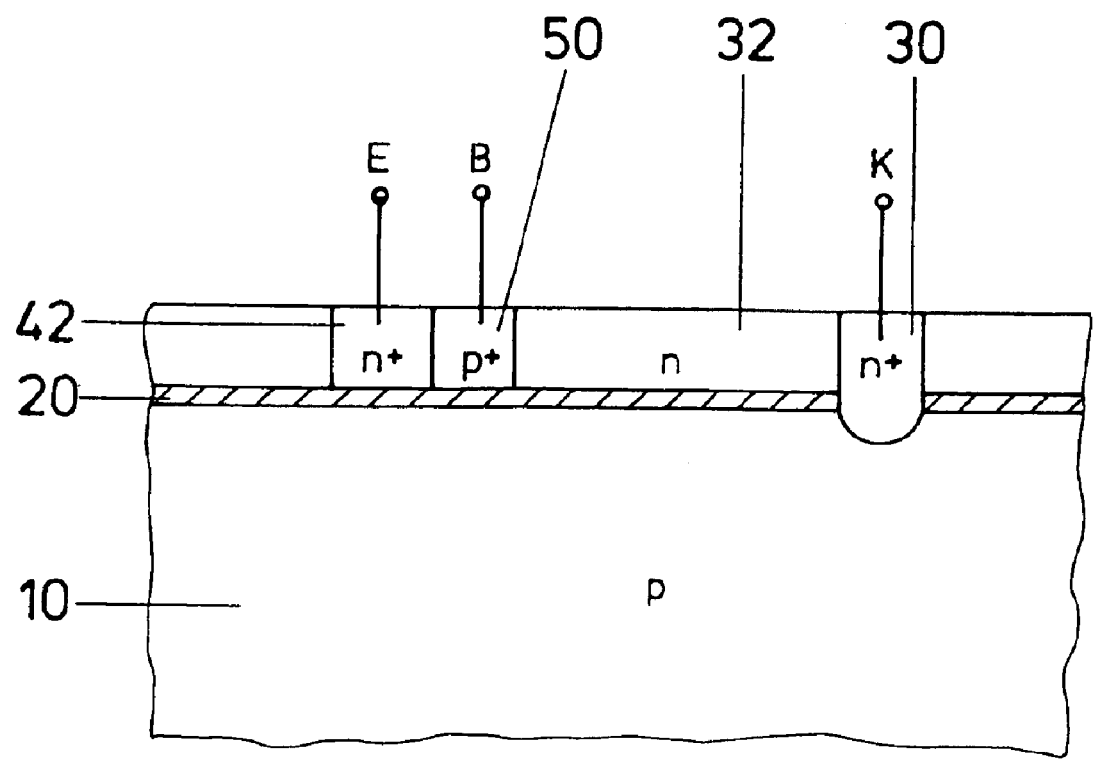
FIG. 4 is a cross sectional view of an exemplary embodiment of a semiconductor component that is designed as a bipolar transistor.

FIG. 4 shows a semiconductor component that is designed as a bipolar transistor, with a p-doped semiconductor substrate 10, an insulation layer 20 applied on the substrate 10, and a semiconductor layer 12 located on the insulation layer 20. An n-doped first terminal zone 30, an n-doped second terminal zone 42, a drift zone 32, and a p-doped depletion zone 50 located between the drift zone 32 and the second terminal zone 42 are formed in the semiconductor layer 12. The first terminal zone 30 forms the collector K of the transistor and extends through the insulation layer 20 right into the semiconductor substrate 10. The second terminal zone 42 forms the emitter E, and depending on the purpose for which the transistor is used, can extend like the collector K down into the substrate 10. The depletion zone 50 forms the base of the transistor.

I claim:

1. A semiconductor component, comprising:
   a semiconductor substrate;
   an insulation layer on said semiconductor substrate, said insulating layer having a thickness of between 50 nm and 200 nm;
   a semiconductor layer configured on said insulation layer;
   a first doped terminal zone and a second doped terminal zone formed in said semiconductor layer; and
   a drift zone formed in said semiconductor layer;
   said drift zone formed between said first doped terminal zone and said second doped terminal zone, said drift zone including a plurality of complementary doped adjacent sections; and
   at least one of said first doped terminal zone and said second doped terminal zone directly adjoining said semiconductor substrate.

2. The semiconductor component according to claim 1, wherein said first terminal zone and said second terminal zone reach through said insulation layer into said substrate.

3. The semiconductor component according to claim 2, wherein said first terminal zone and said second terminal zone are doped complementary with respect to said semiconductor substrate.

4. The semiconductor component according to claim 1, wherein said second terminal zone is of a complementary conduction type with respect to said first terminal zone.

5. The semiconductor component according to claim 1, comprising:
   a depletion zone configured between said second terminal zone and said drift zone;
   said depletion zone having a conduction type; and
   said first terminal zone and said second terminal zone having a conduction type that is complementary to said conduction type of said depletion zone.

6. The semiconductor component according to claim 1, wherein:
   said first terminal zone has a conductor type; and
   said drift zone has a conduction type that is equivalent to the conduction type of said first terminal zone.

7. The semiconductor component according to claim 5, wherein:
   said plurality of said complementary doped adjacent sections includes first sections and second sections;
   said first sections and said first terminal zone are of a first conduction type;
   said first sections are connected to said first terminal zone;
   said second sections and said depletion zone are of a second conduction type complementary to said first conduction type; and
   said second sections are connected to said depletion zone.

8. The semiconductor component according to claim 1, wherein:

said plurality of said complementary doped adjacent sections includes first sections and second sections;

said first sections and said first terminal zone are of a first conduction type;

said first sections are connected to said first terminal zone;

said second sections and said second terminal zone are of a second conduction type complementary to said first conduction type; and said second sections are connected to said second terminal zone.

9. The semiconductor component according to claim 1, wherein said plurality of said complementary doped adjacent sections run in a longitudinal direction between said first terminal zone and said second terminal zone.

10. The semiconductor component according to claim 9, wherein:

said plurality of said complementary doped adjacent sections includes first sections and second sections;

said first sections and said first terminal zone are of a first conduction type;

said first sections are connected to said first terminal zone;

said second sections and said second terminal zone are of a second conduction type complementary to said first conduction type; and said second sections are connected to said second terminal zone.

11. The semiconductor component according to claim 9, comprising:

a depletion zone configured between said second terminal zone and said drift zone;

said plurality of said complementary doped adjacent sections running between said first terminal zone and said depletion zone.

12. The semiconductor component according to claim 1, wherein:

said semiconductor substrate is p-doped; and the one of said first doped terminal zone and said second doped terminal zone that directly adjoins said semiconductor substrate is n-doped.

13. The semiconductor component according to claim 11, wherein:

said plurality of said complementary doped adjacent sections includes first sections and second sections;

said first sections and said first terminal zone are of a first conduction type;

said first sections are connected to said first terminal zone;

said second sections and said depletion zone are of a second conduction type complementary to said first conduction type; and said second sections are connected to said depletion zone.

* * * * *